US011928579B2

(12) United States Patent
Lee et al.

(10) Patent No.: US 11,928,579 B2
(45) Date of Patent: Mar. 12, 2024

(54) SYNAPSE STRING ARRAY ARCHITECTURES FOR NEURAL NETWORKS

(71) Applicant: Seoul National University R&DB FOUNDATION, Seoul (KR)

(72) Inventors: Jong-Ho Lee, Seoul (KR); Sung-Tae Lee, Gwacheon-si (KR)

(73) Assignee: SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 744 days.

(21) Appl. No.: 17/139,089

(22) Filed: Dec. 31, 2020

(65) Prior Publication Data

US 2021/0209454 A1 Jul. 8, 2021

Related U.S. Application Data

(60) Provisional application No. 62/956,433, filed on Jan. 2, 2020.

(51) Int. Cl.
*G06N 3/063* (2023.01)
*G06N 3/04* (2023.01)
(Continued)

(52) U.S. Cl.
CPC .............. *G06N 3/063* (2013.01); *G06N 3/04* (2013.01); *G11C 11/54* (2013.01); *G11C 16/0483* (2013.01); *G11C 16/26* (2013.01)

(58) Field of Classification Search
CPC ......... G11C 16/12; G11C 16/14; G11C 16/10; G11C 16/28; G11C 16/32; G11C 16/08;
(Continued)

(56) References Cited

U.S. PATENT DOCUMENTS 9,767,408 B1 * 9/2017 Boybat Kara ..... G11C 13/0002
2017/0033120 A1 * 2/2017 Lee ........................ H10B 43/27
(Continued)

OTHER PUBLICATIONS

Merrikh-Bayat, et al., High-Performance Mixed-Signal Neurocomputing With Nanoscale Floating-Gate Memory Cell Arrays, IEEE Transactions on Neural Networks and Learning Systems, vol. 29, No. 10, Oct. 2018, pp. 4782-4790.
(Continued)

*Primary Examiner* — Joshua L Schwartz
(74) *Attorney, Agent, or Firm* — CANTOR COLBURN LLP

(57) ABSTRACT

A synapse string includes first and second cell strings each having a plurality of memory cell elements connected in series and first switch elements connected to first or second ends of the first and second cell strings, respectively. The memory cell elements of the first cell string and the memory cell elements of the second cell string are in a one-to-one correspondence, and a pair of the memory cell elements being in a one-to-one correspondence has terminals to which a read voltage is applied connected to each other to constitute one synapse morphic element, so that the synapse string includes a plurality of synapse morphic elements connected in series. A synapse string array architecture enables forward propagation and backward propagation by implementing high-density synapse strings, so that the synapse string array architecture can be applied to a neural network capable of inferencing and on-chip learning, along with inference and recognition.

18 Claims, 6 Drawing Sheets

(51) Int. Cl.
*G11C 11/54* (2006.01)
*G11C 16/04* (2006.01)
*G11C 16/26* (2006.01)

(58) Field of Classification Search
CPC ..... G11C 16/24; G11C 11/54; G11C 16/0483; G06N 3/063
See application file for complete search history.

(56) References Cited

U.S. PATENT DOCUMENTS

2019/0019564 A1* 1/2019 Li ................... G11C 16/0466
2019/0164617 A1* 5/2019 Tran ................. G11C 16/3486

OTHER PUBLICATIONS

Si, et al., A Twin-8T SRAM Computation-In-Memory Macro for Multiple-Bit CNN-Based Machine Learning, 2019 IEEE International Solid-State Circuits Conference, pp. 396-398.
Sun, et al., XNOR-RRAM: A Scalable and Parallel Resistive Synaptic Architecture for Binary Neural Networks, Design, Automation & Test in Europe, 2018, pp. 1423-1428.

* cited by examiner

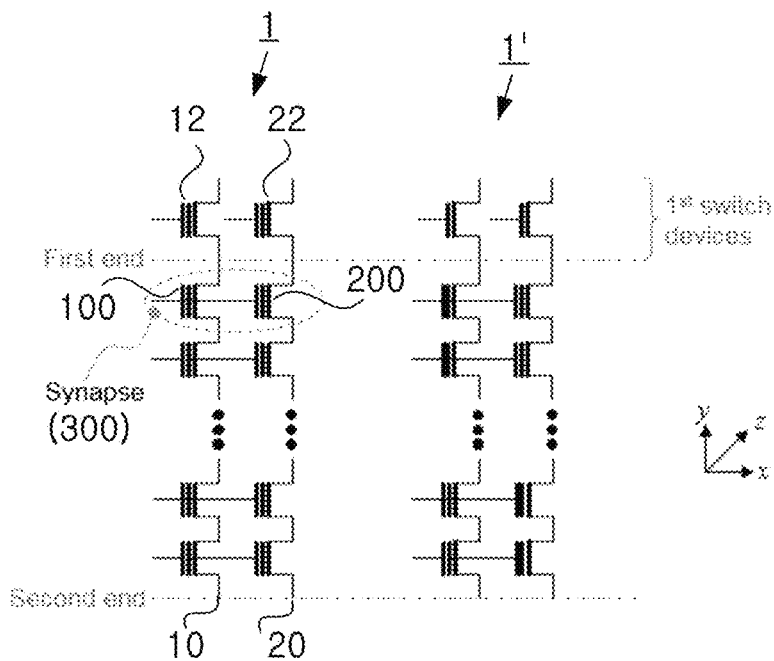
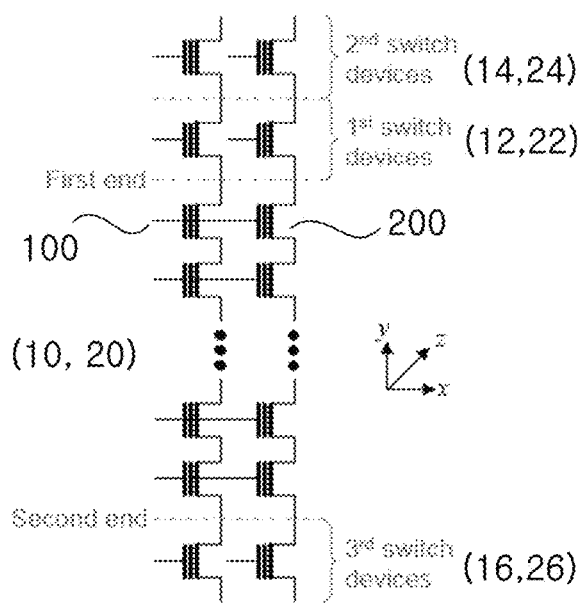

[Fig. 3]
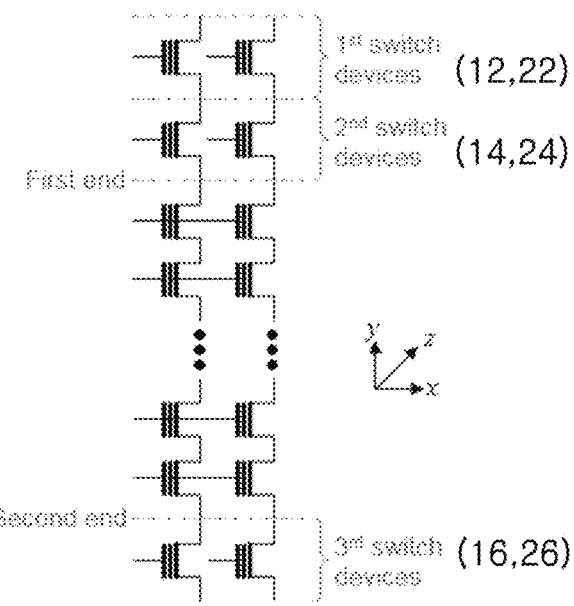
[Fig. 4A]   [Fig. 4B]   [Fig. 4C]
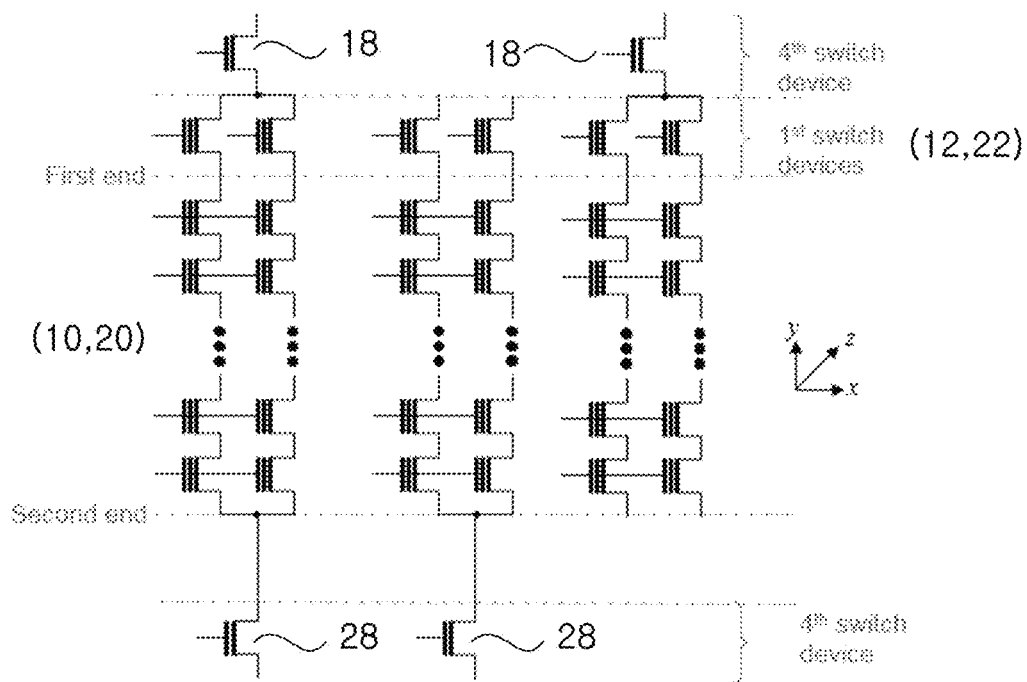

[Fig. 5]
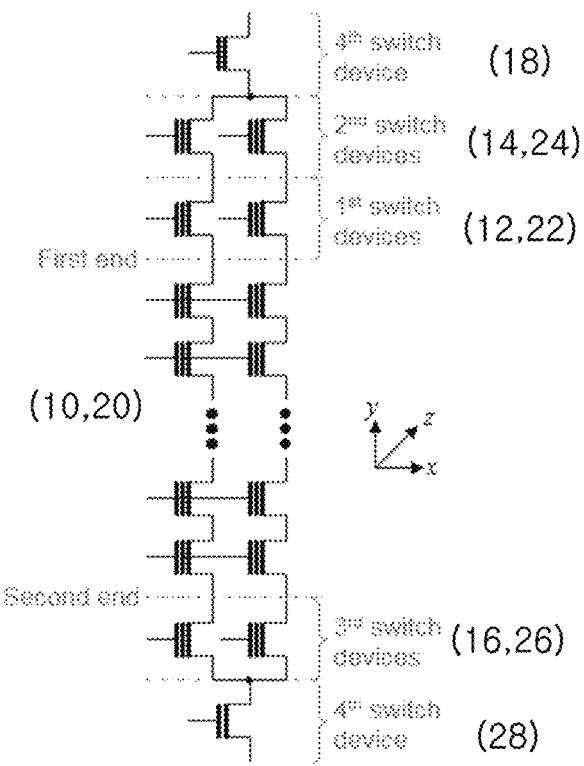
[Fig. 6]
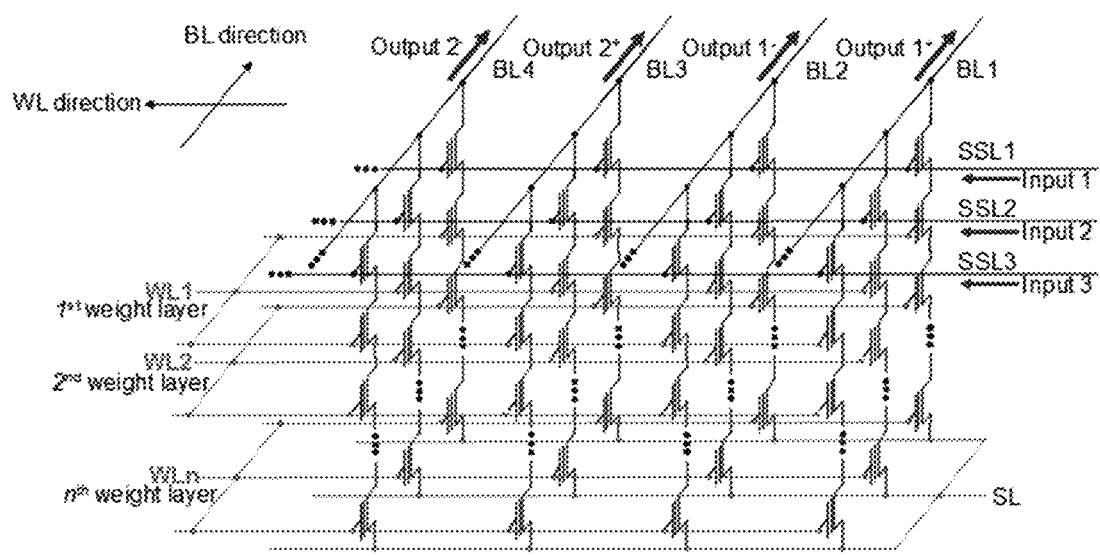

[Fig. 7]
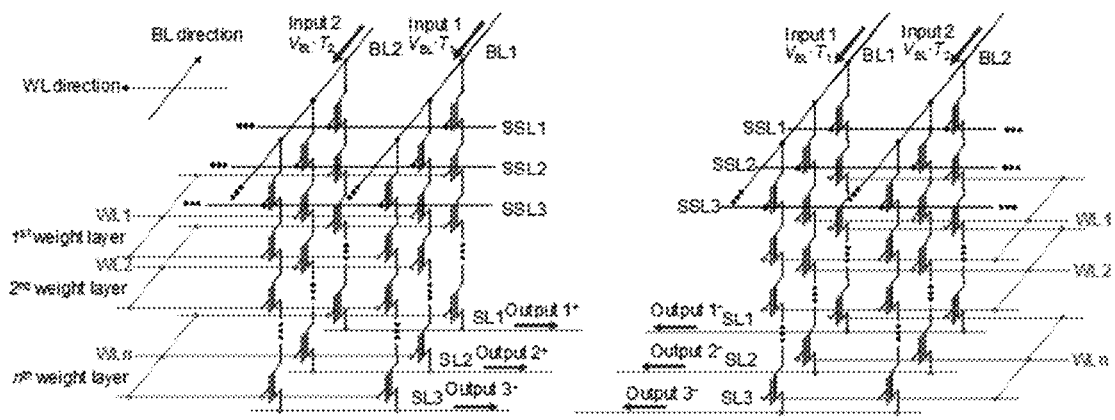
[Fig. 8]
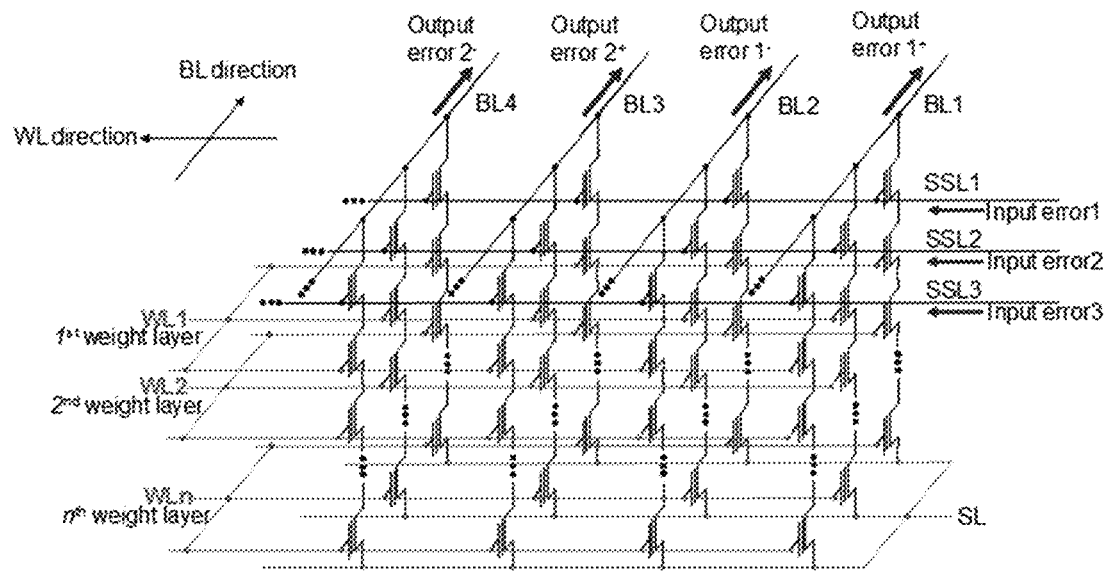

[Fig. 9]
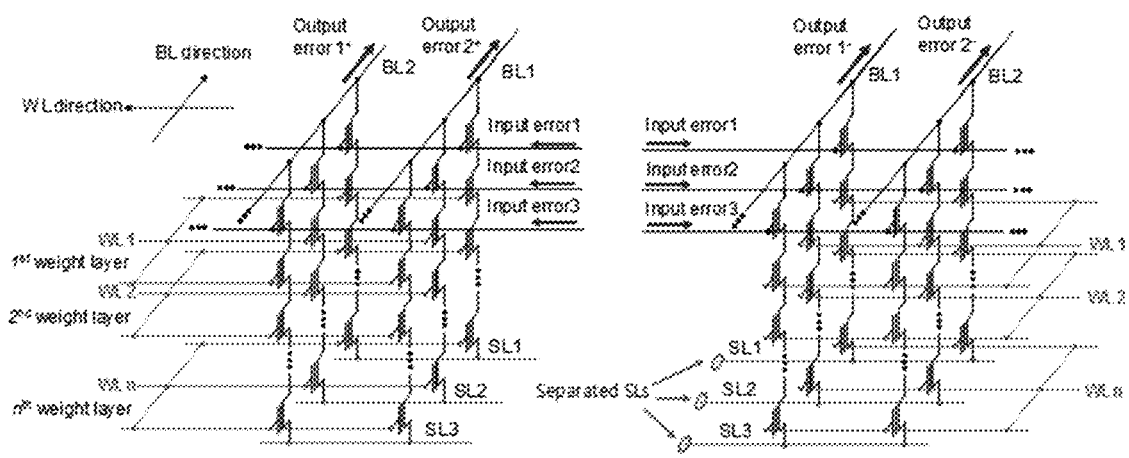
[Fig. 10A]
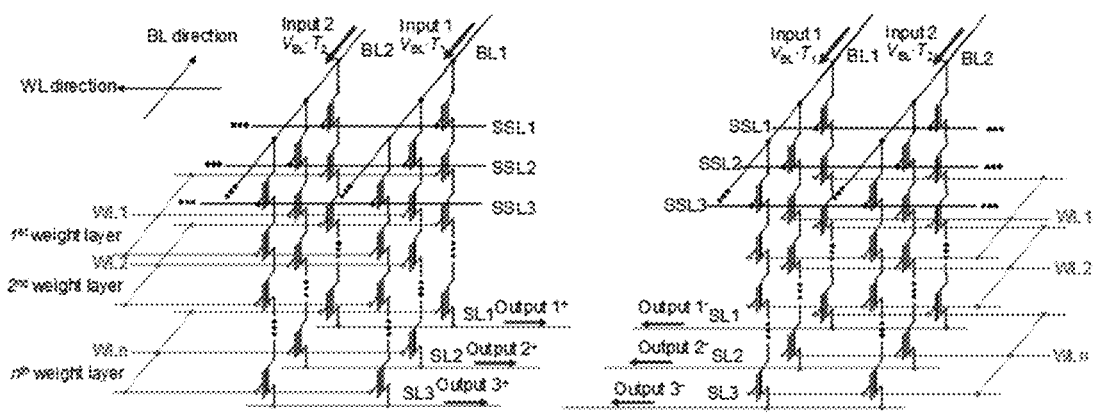

[Fig. 10B]
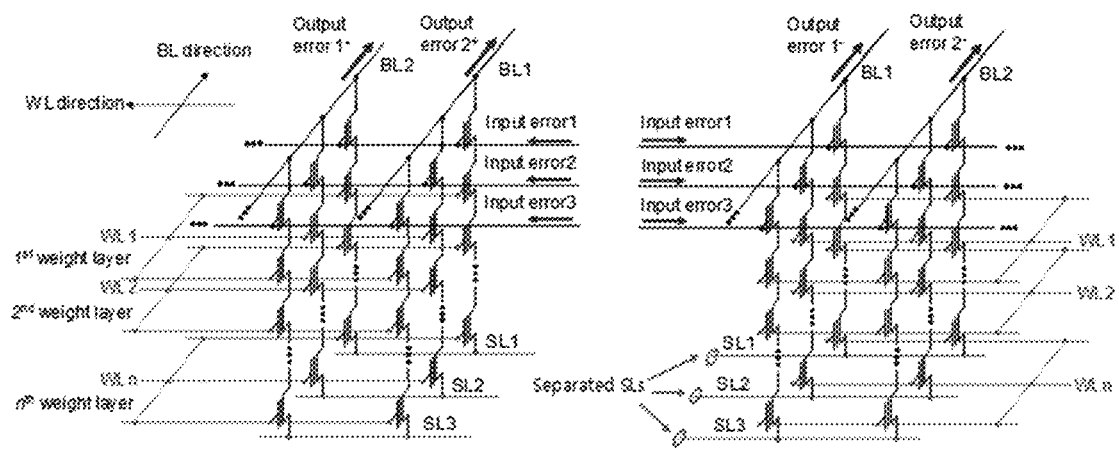
[Fig. 11]
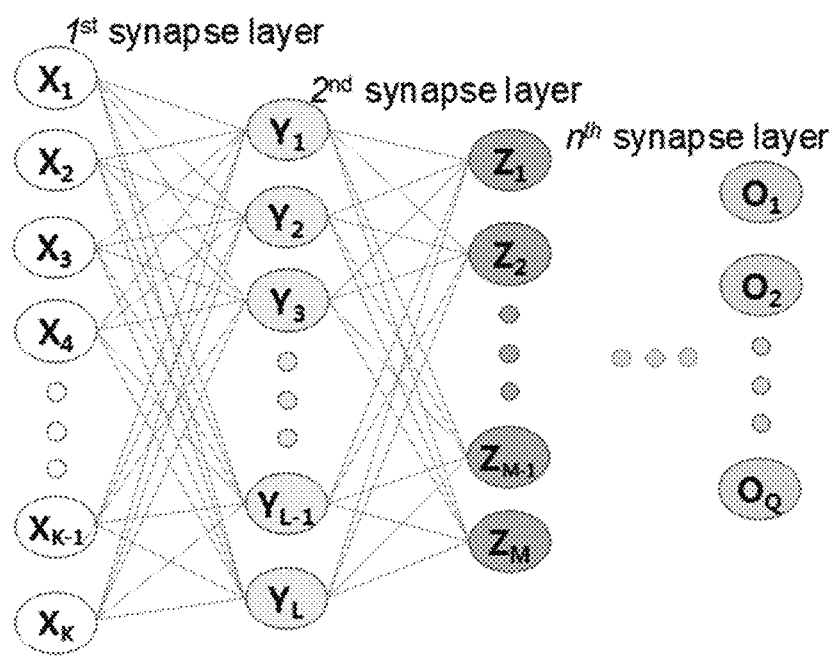

SYNAPSE STRING ARRAY ARCHITECTURES FOR NEURAL NETWORKS

BACKGROUND OF THE INVENTION

1. Field of the Invention

The present invention relates to a neuromorphic technology that can be applied to various neural networks, and more specifically, relates to a synapse string architecture including a plurality of synapse morphic elements having a high degree of integration, a low power, and a high durability by using two-dimensional or three-dimensional memory cell strings and switch elements connected in series to each memory cell string.

2. Description of the Related Art

In recent years, many approaches have been made to imitate nervous systems of animals as power consumption has increased significantly and heat release problems have become more serious in integrated circuits based on the von Neumann architecture. Particularly, in the techniques imitating the nervous systems of animals, it is possible to improve the cognitive function and the determining function by enabling cognitive function and learning while greatly reducing power consumption.

As a result, there is an opportunity to replace or greatly improve the functionality of the existing von Neumann integrated circuits. Therefore, much attention has been increasingly paid to the technique, and the need for research has been greatly increased.

The basic function of neurons is to generate electrical spikes and transmit information to other cells in a case where a stimulus exceeds a threshold value. The resulting electrical signal is called an action potential. Neurons may be roughly divided into three portions. The neuron includes a nerve cell body where a nucleus exists, a dendrite which receives a signal from another cell, and an axon which transmits a signal to another cell. A portion which transmits a signal between the dendrites is called a synapse.

The neuron receives a stimulus from another nerve cell or a stimulus receptor cell and transmits the stimulus to another nerve cell or a glandular cell. Exchanging the stimulus occurs at the synapse. One nerve cell (neuron) receives stimuli through a number of synapses and integrates the excitations, and after that, the nerve cell transmits an electrical spike to an axon near to the nerve cell body, so that the electrical spike reaches the synapse.

In this manner, the transmission of the excitations from the neuron through the synapses to another nerve cell is referred to as excitation transmission. The excitation at the synapse is transmitted only from a nerve fiber toward a nerve cell body or a dendrite and is not transmitted in the reverse direction, so that the excitation is transmitted in only one direction as a whole.

In addition, the synapses are not only relay sites that transmit the excitations but the synapses also cause weighting or inhibition according to temporal or spatial change in excitations reaching the synapses to enable higher level integration of the nervous system.

On the other hand, besides the synapses having the action of transmitting the excitation, there are synapses having the action of inhibiting the transmission of the excitations from other nerve cells. These synapses are called inhibitory synapses. When the excitation transmitted along some nerve fibers reaches the inhibitory synapse, the inhibitory transmitting material is secreted from the synapse. This inhibitory transmitting material acts on a cell membrane of the nerve cell connected to the synapse to inhibit the excitations of the cell from occurring (occurrence of an action potential). As a result, while the inhibitory transmitting material acts, the excitation reaching other synapses is not transmitted to the synapse.

Recently, there have been attempts to implement neural networks by using RRAM elements (Xiaoyu Sun et al., "XNOR-RRAM: A Scalable and Parallel Resistive Synaptic Architecture for Binary Neural Networks", 2018 Design, Automation & Test in Europe Conference & Exhibition). However, in the case of a MEMRISTOR-based synapse of the related art, there are disadvantages in that the reliability of the element is not good and the dispersion between the elements is large.

In addition, recently, there have been attempts to implement neural networks by using SRAM elements (Si, X. et al., "A twin-8T SRAM computation-in-memory macro for multiple-bit CNN-based machine learning" in 2019 IEEE international Solid-State Circuits Conference ISSCC, pp, 396-398). However, implementing a neural network by using the SRAM elements according to the related art described above has a disadvantage in that reliability is good but a degree of integration is low due to using several elements.

Accordingly, the present invention provides synapse array architectures capable of operating with a low power and a high reliability while increasing a degree of integration of synapse morphic elements by using the concept of a NAND flash memory cell string to be applied to various neural networks.

SUMMARY OF THE INVENTION

The present invention is to provide a synapse string including a plurality of synapse morphic elements and switch elements having a high reliability, a low power, and a high degree of integration.

In addition, the present invention is to provide various synapse string array architectures including a plurality of synapse strings including a plurality of synapse morphic elements and a plurality of switch elements having a high reliability, a low power, and a high degree of integration.

According to a first aspect of the present invention, there is provided a synapse string array configured by arranging a plurality of synapse strings in an array form, wherein the synapse string includes: first and second cell strings having a plurality of memory cell elements connected in series; and first switch elements each connected to one of both ends of the first and second cell strings. The memory cell elements of the first cell string and the memory cell elements of the second cell string are in a one-to-one correspondence, and a pair of the memory cell elements being in a one-to-one correspondence has one terminal electrically connected to each other to constitute one synapse morphic element. The terminals electrically connected to each other of the memory cell elements being in a one-to-one correspondence are terminals to which a read voltage or a pass voltage is applied or to which a program voltage or an erase voltage is applied. And, the plurality of pairs of memory cell elements included in the first and second cell strings of the synapse string constitute a plurality of synapse morphic elements.

The memory cell elements on the same layer in the synapse string array are connected though the word line (WL), the ends of the first switch elements of the synapse string array are connected in the direction of the bit line (BL) through the bit line BL, the gate (or control gate) electrodes of the first switch elements of the synapse string array are connected in the direction of the word line (WL) through the string-select line (SSL), and the ends of the memory cell elements located at the bottoms of the synapse strings constituting the synapse string array are connected through a source line (SL).

In the synapse string array according to the first aspect, it is preferable that in order to execute forward propagation of learning, synapse string array is configured to apply an input to a string-select line (SSL) and read an output from a bit line (BL).

In the synapse string array according to the first aspect, it is preferable that in order to execute backward propagation of learning, the synapse string array is configured to apply an input error to a string-select line (SSL) and read an output error through the bit line (BL).

In the synapse string array according to the first aspect, it is preferable that the synapse string array is divided into a first block and a second block, the first block is configured to apply an input through a string-select line (SSL) and read an output through the bit line (BL) in order to execute forward propagation of learning, the second block is configured to apply an input error to a string-select line (SSL) and read an output error through the bit line (BL) in order to execute backward propagation of learning, and on-chip learning is implemented by sequentially driving the first block and the second block to sequentially execute forward propagation and backward propagation.

In the synapse string array according to the first aspect, it is more preferable that the memory cell elements constituting the synapse string arrays constituting the second block for the backward propagation are configured to have weights that are randomly distributed.

In the synapse string array according to the first aspect, it is preferable that the source line (SL) is configured with a single source line (SL), and the cell strings constituting the synapse string array are connected to the single source line (SL), or the source line (SL) is configured to be connected to each other along a direction of the word line (WL), and the cell strings constituting the synapse string array are connected to the respective source lines (SL) along the direction of the word line (WL), or the source line (SL) is configured to be connected to each other along the direction of the bit line (BL) and the cell strings constituting the synapse string array are connected to the respective source lines (SL) along the direction of the bit line (BL).

In the synapse string array according to the first aspect, it is preferable that the source line (SL) is configured to be connected to each other along the direction of the word line (WL), and the cell strings constituting the synapse string array are connected to the respective source lines (SL) along the direction of the word line (WL), and forward propagation of learning is configured to be executed by applying an input to the bit line (BL) and reading an output through the source line (SL).

In the synapse string array according to the first aspect, it is preferable that the source line (SL) is configured to be connected to each other along the direction of the word line (WL), and the cell strings constituting the synapse string array are connected to the respective source lines (SL) along the direction of the word line (WL), and backward propagation of learning is configured to be executed by applying an input error to the string-select line (SSL) and read an output error through the bit line (BL).

In the synapse string array according to the first aspect, it is preferable that the source line (SL) is configured to be connected to each other along the direction of the word line (WL), and the cell strings constituting the synapse string array are connected to the respective source lines (SL) along the direction of the word line (WL), and on-Chip Learning is implemented by sequentially perform an operation of executing forward propagation of learning by applying an input to the bit line (BL) and reading an output through the source line (SL) and an operation of executing backward propagation of learning by applying an input error to the string-select line (SSL) and reading an output error through the bit line (BL).

In the synapse string array according to the first aspect, it is preferable that an input signal or an input error signal can be input to the synapse string array, and the input signal or the input error signal is configured with one of a rate encoding signal, a width encoding signal, and a temporal encoding signal.

In the synapse string array according to the first aspect, it is preferable that cells connected to an n-th word line (n is a natural number larger than or equal to 1, indicating a layer of a word line) correspond to synapses of an n-th synapse layer of a neural network.

In the synapse string array according to the first aspect, it is preferable that the memory cell elements of the first and second cell strings of the synapse string are configured as elements (including MOSFETs) having a non-volatile memory function, and the memory cell elements of which pair constitute a synapse morphic element have gate terminals or control gate terminals connected to each other.

In the synapse string array according to the first aspect, it is preferable that the first switch elements of the synapse string are configured with one of a MOSFET, an element having a non-volatile memory function, and an element such as the memory cell element.

In the synapse string array according to the first aspect, it is preferable that the synapse string further includes second and third switch elements, the second switch elements are connected in series to the first switch elements, respectively, or connected in series between the first and second cell strings and the first switch elements, respectively, the third switch elements are connected in series to ends to which the second switch elements of the first and second cell strings are not connected, respectively, and the second and third switch elements are configured with one of a MOSFET, an element having a non-volatile memory function, and an element such as the memory cell element.

In the synapse string array according to the first aspect, it is preferable that the synapse string further includes a fourth switch element, the fourth switch element is connected in series to one or two ends of both ends of the synapse string, and the fourth switch element is configured with one of a MOSFET, a MOSFET having a non-volatile memory function, and an element such as the memory cell element.

In the synapse string array according to the first aspect, it is preferable that a read voltage (read bias) is applied to the connected terminals of the pair of memory cell elements constituting a specific synapse, a pass voltage (pass bias) is applied to the connected terminals of the pairs of memory cell elements constituting the other synapses except for the specific synapse, and information stored in the memory cell elements constituting the specific synapse is read in a state where input signals are applied to input terminals of the first switch elements, respectively.

In the synapse string array according to the first aspect, it is preferable that the synapse string array further comprises a switch element between the memory cell element and the source line SL of the synapse string.

Since the synapse string according to the present invention includes the plurality of synapse morphic elements connected in series, it is possible to greatly increase the degree of integration. In addition, the synapse morphic element of the synapse string according to the present invention is configured with two MOSFETs or flash memory cell elements including a charge storage layer, and thus, the synapse morphic element has excellent durability and reliability.

In addition, the synapse string according to the present invention is configured with the plurality of synapse morphic elements connected in series and first switch elements, so that matrix multiplication operation can be stably performed. A switch element can be added in series to the first switch element.

In addition, the synapse string and the synapse string array according to the present invention can be manufactured by using an existing 2D or 3D NAND flash technology. Accordingly, in a case where a neural network is configured by using the synapse string and the synapse string array according to the present invention, it is possible to greatly increase the degree of integration and reliability of neural networks and to reduce power consumption.

In addition, the synapse array architecture of the present invention enables off-chip learning or on-chip learning. In the case of off-chip learning, it is possible to perform inference with high accuracy at a low power by copying the weights learned by a deep learning algorithm to the synapse array. In the case of on-chip learning, when learning can be performed in the neural network chip using big data, in consideration of various situations (specific synapse operation problems, changes in the weight of the synapse morphic element, problems in resistance of wiring, delay, and the like) that occur in the neural network chip, there is an advantage that weights are obtained as a result of the learning.

In addition, the synapse array architecture capable of on-chip learning has the advantage of being able to promote convenience by user-friendly learning by being applied to various mobile devices or edge devices requiring a low power.

BRIEF DESCRIPTION OF THE DRAWINGS

FIGS. 1A and 1B are circuit diagrams illustrating a first example of a synapse string in a synapse string array according to the present invention;

FIG. 2 is a circuit diagram illustrating a second example of the synapse string in the synapse string array according to the present invention;

FIG. 3 is a circuit diagram illustrating a modified example of a second switch element in the second example of the synapse string of FIG. 2 in the synapse string array according to the present invention;

FIGS. 4A, 4b and 4C are a circuit diagram illustrating a fourth example of the synapse string in the synapse string array according to the present invention;

FIG. 5 is a circuit diagram illustrating a fifth example of the synapse string in the synapse string array according to the present invention;

FIG. 6 is a circuit diagram illustrating a first example of the synapse string array according to the first embodiment of the present invention;

FIG. 7 is a circuit diagram illustrating a second example of the synapse string array according to the first embodiment of the present invention;

FIG. 8 is a circuit diagram illustrating a first example of a synapse string array according to a second embodiment of the present invention;

FIG. 9 is a circuit diagram illustrating a second example of the synapse string array according to the second embodiment of the present invention;

FIGS. 10A and 10B are a circuit diagram illustrating a synapse string array according to a third embodiment of the present invention; and FIG. 11 is an example of a neural network configured with synapses and neurons.

DETAILED DESCRIPTION

According to the present invention, there is provided a synapse string array architecture configured by arranging a plurality of synapse strings in an array form, wherein the synapse string is configured with two NAND flash memory cell strings, wherein a synapse morphic element is implemented a pair of cells of each string in two NAND flash memory cell strings constituting the synapse string, and wherein a highly integrated synapse string capable of performing a matrix multiplication operation by using the synapse morphic elements and a switch element provided in each cell string and having high reliability. Herein, the cells of the cell string may have the same cell structure (blocking insulating layer, charge storage layer, tunneling insulating layer) as existing NAND flash memory cells. In addition, the charge storage layer may have two or more layers, and the dielectric constants of the adjacent charge storage layers are different. In addition, the blocking insulating layer or the tunneling insulating layer is configured with two or more insulating layers, and the blocking insulating layer or the tunneling insulating layer can be implemented with materials having different dielectric constants. In addition, any one of the blocking insulating layer and the tunneling insulating layer can be removed. Two NAND cells constituting one synapse represent positive and negative weights, respectively.

In particular, the synapse morphic element according to the present invention allows various amounts of negative (−) or positive (+) charges to be stored in the charge storage layer according to a program or erase operation, so that the weight of a general synapse can be changed. In addition, since the synapse morphic elements of the synapse string array according to the present invention preferably use NAND flash memory cells, it is possible to implement the synapse morphic elements in a small area with high reliability. Various synapse morphic elements having memory characteristics can be applied to a string-structure based synapse array architecture.

In addition, the synapse string according to the present invention can be used for various neural network systems.

Hereinafter, a synapse string array according to exemplary embodiments of the present invention will be described in detail with reference to the accompanying drawings. The synapse string array according to the present invention is configured by arranging the plurality of synapse strings in an array form. Therefore, first, basic structures of the synapse strings of various forms used in the synapse string array of the present invention will be described with reference to FIGS. 1 to 5. Next, a synapse string array architecture in which the plurality of synapse strings described above are connected in an array for forward propagation and backward propagation according to the first to second embodiments of the present invention will be described. Next, a third embodiment of the present invention will be described with respect to a synapse string array architecture enabling on-chip learning of the present invention.

<Synapse String>

FIGS. 1A and 1B are circuit diagrams illustrating a first example of a synapse string in a synapse string array according to the present invention. Referring to FIGS. 1A and 1B, the synapse string 1 according to the present invention includes first and second cell strings 10 and 20 each having a plurality of memory cell elements 100 and 200 connected in series and first switch elements 12 and 22 connected to the respective ends of the first and second cell strings.

The memory cell elements 100 of the first cell string 10 and the memory cell elements 200 of the second cell string 20 are in a one-to-one correspondence, and pair 300 of the memory cell elements has one terminal electrically connected to each other to constitute one synapse morphic element. The terminals (for example, gates or control gates) electrically connecting the memory cell elements constituting one synapse morphic element to each other are preferably terminals to which a read voltage or a pass voltage is applied or to which a program voltage or an erase voltage is applied among the terminals of the memory cell elements. On the other hand, a voltage for switching may be applied to terminals electrically connecting the memory cell elements to each other as necessary.

A plurality of pairs of the memory cell elements included in the first and second cell strings constitute the plurality of synapse morphic elements, and as a result, the synapse string including the first and second cell strings includes a plurality of synapse morphic elements. The first and second cell strings for the synapse strings among the first and second cell strings can be arranged adjacent to each other or can be arranged at different locations or in different blocks.

The memory cell elements of the first and second cell strings are configured with devices (including MOSFETs) having a non-volatile memory function, and in this case, the memory cell elements constituting a pair preferably have a gate terminal or a control gate terminal connected to each other.

The first switch elements 12 and 22 are connected to only one end of both ends of the first and second cell strings 10 and 20. In this specification, for the convenience of description, the ends of the first and second cell strings to which the first switch elements 12 and 22 are connected are defined as the first ends of the first and second cell strings, and the remaining ends of the first and second cell strings are defined as the second ends. The input signals input to the respective input terminals of the first switch elements can be configured with signals from previous neurons. The first switch elements can be formed of one of a MOSFET, an element having a non-volatile memory function, and an element such as the memory cell element. FIG. 1A illustrates the first switch elements configured as an element (including a MOSFET) having a non-volatile memory function or a flash memory cell element, and FIG. 1B illustrates the first switch elements configured as a MOSFET. In this case, the input terminals of the first switch elements can be gate electrodes, drain electrodes, or control electrodes, and if the first switch element is an element having a non-volatile memory function, the threshold voltage can be changed by using the non-volatile memory function.

FIG. 2 is a circuit diagram illustrating a second example of the synapse string in the synapse string array according to the present invention.

Referring to FIG. 2, the second example of the synapse string according to the present invention further includes second and third switch elements in the synapse string according to the first example described above. Therefore, the second example of the synapse string according to the present invention includes the first and second cell strings 10 and 20 each having the plurality of memory cell elements 100 and 200 connected in series, the first switch elements 12 and 22 connected to the first ends of the first and the second cell strings, respectively, the second switch elements 14 and 24 connected in series to the first switch elements, and the third switch elements 16 and 26 connected in series to the second ends of the first and second cell strings, respectively.

Since the first and second cell strings and the first switch elements are the same as those of the first example described above, redundant descriptions will be omitted.

As illustrated in FIG. 2, the second switch elements 14 and 24 are preferably connected in series to the respective first switch elements.

On the other hand, in a modified example of the second switch elements, as illustrated in FIG. 3, the second switch elements can be connected in series between the first switch elements and the first ends of the first and second cell strings.

FIG. 3 is a circuit diagram illustrating the modified example of the second switch elements of the second example of the synapse string in the synapse string array according to the present invention. The third switch elements 16 and 26 are preferably connected in series to the respective second ends of the first and second cell strings. Similarly to the first switch elements, the second and third switch elements are preferably configured with one of a MOSFET, an element (including a MOSFET) having a non-volatile memory function, and an element such as the memory cell element. In the second example of the synapse string according to the present invention, an input value is input in the first switch, and the second and third switches are provided to allow the memory cell elements in the first and second cell strings to perform independently program or erasing. Also, although not mentioned in the present invention, a voltage required for the array operation can be applied to the switch elements. When the input value is input to the first switch, by using the second switch and the third switch, the first and second cell strings can be separately programmed or erased, or the first and second cell strings can be collectively programmed or erased. On the other hand, when the synapse string array is configured, by using array the second switch and the third switch, a specific synapse string in the synapse string array can be selectively operated.

The third example of the synapse string according to the present invention further includes a second switch element in the synapse string according to the first example described above. Therefore, in the third example of the synapse string according to the present invention, first and second cell strings each having a plurality of memory cell elements connected in series and first switch elements and second switch elements connected to first ends of the first and second cell strings, respectively, are provided. Since the first and second cell strings and the first switch elements are the same as those of the first example described above, redundant descriptions will be omitted.

It is preferable that the second switch elements are each connected in series to the first switch elements, the second switch elements are connected in series between the first switch elements and the first ends of the first and second cell strings, or the second switch elements are connected in series to the second ends of the first and second cell strings. Similarly to the first switch elements, the second switch elements are preferably configured with one of a MOSFET, an element (including a MOSFET) having a non-volatile memory function, and an element such as the memory cell element. The second switch element according to the third example operates in the same manner as the second or third switch element according to the second example.

FIGS. 4A to 4C are circuit diagrams illustrating a fourth example of the synapse string in the synapse string array according to the present invention. Referring to FIGS. 4A to 4C, in the synapse string array according to the present invention, the fourth example of the synapse string further includes a fourth switch element in the synapse string according to the first example. Therefore, the fourth example of the synapse string of the synapse string array according to the present invention includes the first and second cell strings 10 and 20 having the plurality of memory cell elements 100 and 200 connected in series, respectively, and first switch elements 12 and 22 and fourth switch elements 18 and 28 connected to first ends of the first and second cell strings, respectively. Since the first and second cell strings and the first switch elements are the same as those of the first example, redundant descriptions will be omitted It is preferable that, each of the fourth switch elements 18 and 28 is connected in series to the first switch elements electrically connected to each other and connected in series to the second ends of the first and second cell strings electrically connected to each other as illustrated in FIG. 4A, each of the fourth switch elements 18 and 28 is connected in series to only the first switch elements electrically connected to each other as illustrated in FIG. 4C, or each of the fourth switch elements 18 and 28 is connected in series to the second ends of the first and second cell strings electrically connected to each other as illustrated in FIG. 4B.

In addition, one or more switch elements can be additionally connected in series to each of the first and second cell strings at the second ends in FIGS. 4A, 4B, and 4C, and in this case, the fourth switch element is connected in series with the additional switch element. In FIGS. 4A, 4B, and 4C, the first and second cell strings can be arranged at adjacent positions or can be arranged at different positions or in different blocks. The additional switch element can be connected in series to the fourth switch element. Similarly to the first switch elements, the fourth switch elements are preferably configured with ne of a MOSFET, an element (including a MOSFET) having a non-volatile memory function, and an element such as the memory cell element. In the case of implementing a synapse string array including the plurality of synapse strings, the fourth switch can be used to select a specific synapse string among the plurality of synapse strings.

FIG. 5 is a circuit diagram illustrating a fifth example of the synapse string in the synapse string array according to the present invention. Referring to FIG. 5, the fifth example of the synapse string according to the present invention further includes the fourth switch element in the synapse string according to the second example described above. Therefore, the fifth example of the synapse string according to the present invention includes the first and second cell strings 10 and 20 having a plurality of memory cell elements 100 and 200 connected in series, respectively, the first switch elements 12 and 22 connected to the first ends of the first and second cell strings, respectively, the second switch elements 14 and 24 connected in series to the first switch elements, and the third switch elements 16 and 26 and the fourth switch elements 18 and 28 connected in series to the second ends of the first and second cell strings, respectively. Since the first and second cell strings and the first, second, and third switch elements are the same as those of the second example described above, redundant descriptions will be omitted.

It is preferable that each of the fourth switch elements 18 and 28 is connected in series to the second switch elements electrically connected to each other and connected in series to the third switch elements electrically connected to each other as illustrated in FIG. 5, or each of the fourth switch elements 18 and 28 is connected in series to only the second switch elements electrically connected to each other or connected to only the third switch elements electrically connected to each other. An additional switch element can be connected in series to the fourth switch element. Similarly to the first switch elements, the fourth switch elements are configured with one of a MOSFET, an element (including a MOSFET) having a non-volatile memory function, and an element such as the memory cell element. In the case of implementing a synapse string array including a plurality of synapse strings, the fourth switch can be used to select a specific synapse string among the plurality of synapse strings.

Hereinafter, a synapse string array architecture configured by using the above-described synapse strings according to the first to third embodiments of the present invention will be described in detail.

First Embodiment

FIG. 6 is a circuit diagram illustrating a first example of a synapse string array for forward propagation according to the first embodiment of the present invention. Referring to FIG. 6, the synapse string array according to the first embodiment of the present invention is expanded into an array form by arranging the plurality of synapse strings. The synapse string is configured with one of the above-described synapse strings. In several drawings, the arrow direction indicates an example of the operation description.

in an example of the synapse string array according to the first example, when the plurality of cell strings are used, the first cell string and the second cell string constituting one synapse string can be adjacently arranged in the same array or can be separately arranged in different arrays. In addition, in an example of the synapse string array according to the first example, when the plurality of cell strings or synapse strings are used, the read voltage and the pass voltage can be applied to the gate terminals of the memory cell elements constituting each synapse morphic element of the synapse string. In addition, in an example of the synapse string array according to the first example, the gate (or control gate) of the first switch element is connected through the string-select line (SSL), an input is applied to the string-select line, and the combined current of the cell string can be read as an output through the bit line (BL).

In addition, in an example of the synapse string array according to the first example, as illustrated in FIG. 6, the cell strings can be connected to a single source line (SL). In addition, each cell string is connected to the source line SL, but the cell strings arranged in a direction parallel to the direction of the bit line BL or the word line WL may be connected to the same source line SL. Although not illustrated in FIG. 6, the switch element can be added for each string or for each array block between the last memory cell element of the word line WL and the source line SL.

FIG. 7 is a circuit diagram illustrating a second example of the synapse string array according to the first embodiment of the present invention. Referring to FIG. 7, the synapse string array according to the first embodiment of the present invention expands into an array by arranging the plurality of basic synapse strings, and the synapse string is configured with one of the above-described synapse strings.

An example of the synapse string array according to the second example is, in the case of using the plurality of cell strings, the first cell string and the second cell string constituting one synapse string are located in different arrays. In addition, in an example of the synapse string array according to the second example, as illustrated in FIG. 7, the source line (SL) is separated, and the cell string is connected to the source line SL in the direction of the word line (WL). In addition, in an example of the synapse string array according to the second example, when the plurality of cell strings or synapse strings are used, the read voltage and the pass voltage can be applied to the gate terminals of the memory cell elements constituting each synapse morphic element of the synapse string. In addition, in an example of the synapse string array according to the second example, the gate (or control gate) of the first switch element is connected though the string-select line, an input is applied to the bit line (BL), and the combined current of the cell string can be read as an output through source line (SL). Although not illustrated in FIG. 7, a switch element can be added between the last memory cell element of the word line WL and the source line SL for each string or for each source line SL.

Second Embodiment

FIG. 8 is a circuit diagram illustrating a first example of a synapse string array for backward propagation according to a second embodiment of the present invention. Referring to FIG. 8, in the synapse string array according to the second embodiment of the present invention, the plurality of synapse strings are arranged to expand into an array. The synapse string is configured with one of the above-described synapse strings.

In an example of the synapse string array according to the first example is, when the plurality of cell strings are used, the first cell string and the second cell string constituting one synapse string are can be adjacently arranged in the same array or can be separately arranged in different arrays. In addition, in an example of the synapse string array according to the first example, when the plurality of cell strings or synapse strings are used, the read voltage and the pass voltage can be applied to the gate terminals of the memory cell elements constituting each synapse morphic element of the synapse string. In addition, in an example of the synapse string array according to the first example, the gate (or control gate) of the first switch element is connected through the string-select line, an input error is applied to the string-select line, and a combined output error can read through the error bit line.

In addition, in an example of the synapse string array according to the first example, as illustrated in FIG. 8, the source lines (SL) may be connected, or the source lines SL may be separated from each other along the word lines or the bit lines. Although not illustrated in FIG. 8, a switch element can be added for each string or for each array block between the last memory cell element of the word line WL and the source line SL.

In addition, an example of the synapse string array according to the first example may have weights that are randomly distributed. As an example, FIGS. 6 and 8 illustrate the synapse array architectures implementing forward propagation and backward propagation using direct feedback alignment, respectively. An architecture that performs only forward propagation performs an off-chip learning operation that only performs inference and recognition, and an architecture that can perform both forward propagation and backward propagations can perform an on-chip learning operation that can perform both inference and learning.

As an example, the synapse elements of the synapse array architecture of FIG. 6 may have weights that is changed by learning, and the synapse elements of the synapse array architecture of FIG. 8 may have weights that are randomly distributed.

FIG. 9 is a circuit diagram illustrating a second example of the synapse string array according to the second embodiment of the present invention. Referring to FIG. 9, the synapse string array according to the second embodiment of the present invention expands into an array by arranging the plurality of basic synapse strings, and the synapse string is configured with one of the above-described synapse strings.

In an example of the synapse string array according to the second example, when the plurality of cell strings are used, the first cell string and the second cell string constituting one synapse string are located in different array positions. In addition, in an example of the synapse string array according to the second example, when the plurality of cell strings or synapse strings are used, the read voltage and the pass voltage can be applied to the gate terminals of the memory cell elements constituting each synapse morphic element of the synapse string. In addition, in an example of the synapse string array according to the second example, the gate (or control gate) of the first switch element is connected through the string-select line. The input error can be applied to the string-select line (SSL), and the combined output error can be read through the bit line (BL). Although not illustrated in FIG. 9, a switch element can be added for each string or for each SL between the last memory cell element of the word line WL and the source line SL.

Third Embodiment

FIG. 10 is a circuit diagram illustrating a synapse string array for on-chip learning according to a third embodiment of the present invention. Referring to FIGS. 10A and 10B, the synapse string array according to the third embodiment of the present invention is expanded into an array by arranging a plurality of synapse strings. The synapse string is configured with one of the above-described synapse strings.

The synapse string array for on-chip learning according to the present embodiment is configured by arranging the plurality of synapse strings in an array form as illustrated in FIG. 10. FIG. 10A is a circuit diagram of the first block in which forward propagation is implemented by providing an input signal and an output signal, and FIG. 10B is a circuit diagram of the second block in which backward propagation is implemented by providing an input error signal and an output error signal. Herein, as the same synapse string array is used for forward propagation and backward propagation, the total size of the synapse string array does not increase.

In an example of the synapse string array according to the present embodiment, when the plurality of cell strings are used, the first cell string and the second cell string constituting one synapse string can be located adjacent to each other in the same array or can be located separately in different arrays. In addition, in an example of the synapse string array according to the present embodiment is, when the plurality of cell strings or synapse strings are used, the read voltage and the pass voltage can be applied to the gates (or control gates) of the memory cell elements constituting each synapse morphic element of the synapse string.

In addition, in the synapse string array according to the present embodiment, in order to implement forward propagation learning, the gate (or control gate) of the first switch element is connected through the string-select line, an input is applied to the bit line, and the combined output can be read though the source line. In addition, in order to implement backward propagation learning in the synapse string array according to the present embodiment, the gate (or control gate) of the first switch element is connected though the string-select line, an input error is applied to the string-select line, and the combined output error can be read though the bit line.

On the other hand, in another example of the synapse string array for implementing on-chip learning according to the present embodiment, the synapse string array is divided into a first block and a second block, the first block is configured to apply an input through the select line (SSL) and read an output through the bit line (BL) in order to execute forward propagation of learning, and the second block is configured to apply an input error to the string-select line (SSL) and read an output error through the bit line (BL) in order to execute backward propagation of learning. In the synapse string array according to the present embodiment having the above-described configuration, on-chip learning is implemented by sequentially driving the first block and the second block to sequentially execute forward propagation and backward propagation. The memory cell elements constituting the synapse string arrays constituting the second block for backward propagation can be configured to have weights that are randomly distributed.

On the other hand, in an example of the synapse string array according to the second and third embodiments described above, the source line (SL) are separated from each other as illustrated in FIGS. 7, 9 and 10. In addition, although not illustrated in FIGS. 6 to 10, at least one switch element can be connected to each cell string connected to the source line SL. In addition, as described above, at least one switch element can be connected in series between the source line SL and each synapse string configured with a pair of negative (−) and positive (+) cell strings. In addition, at least one switch element can be connected in series to each synapse string connected to the bit line (BL).

In the synapse string array according to the first to third embodiments described above, the input and the input error may have a form of rate encoding, width encoding, temporal encoding, or the like. Herein, width encoding represents the size of the signal by adjusting the width of the pulse.

FIG. 11 is an example of a neural network configured with neurons and synapses. The cells connected to the n-th word line in the synapse string array of FIGS. 6 to 10 (where n is a natural number) correspond to the synapses in the n-th synapse layer of FIG. 11. For example, the cells connected to the first word line correspond to the synapses in the first synapse layer of FIG. 11.

The synapse string including at least two cell strings and a switch element according to the present invention has a high degree of integration due to a small occupied area and is reliable based on silicon technology. Since the synapse string can be used to implement various functions that need to be implemented in neuromorphic technology, the synapse string can be widely used in the field of neuromorphic technology that requires a low power and a high degree of integration.

While the present invention has been particularly illustrated and described with reference to exemplary embodiments thereof, it should be understood by the skilled in the art that the invention is not limited to the disclosed embodiments, but various modifications and applications not illustrated in the above description can be made without departing from the spirit of the invention. In addition, differences relating to the modifications and applications should be construed as being included within the scope of the invention as set forth in the appended claims.

In addition, differences relating to the modifications and applications should be construed as being included within the scope of the invention as set forth in the appended claims.

What is claimed is:

1. A synapse string array configured by arranging a plurality of synapse strings in an array form, wherein the synapse string includes:
  first and second cell strings each having a plurality of memory cell elements connected in series; and first switch elements connected to one of both ends of the first and second cell strings, respectively, wherein the memory cell elements of the first cell string and the memory cell elements of the second cell string are in a one-to-one correspondence,
  and a pair of the memory cell elements being in a one-to-one correspondence has one terminal electrically connected to each other to constitute one synapse morphic element,
  and wherein the terminals electrically connected to each other of the memory cell elements being in a one-to-one correspondence are terminals to which a read voltage or a pass voltage is applied or to which a program voltage or an erase voltage is applied
  wherein the plurality of pairs of memory cell elements included in the first and second cell strings of the synapse string constitute a plurality of synapse morphic elements
  wherein, the memory cell elements on the same layer in the synapse string array are connected though the word line (WL),
  wherein the ends of the first switch elements of the synapse string array are connected in the bit line (BL) direction through the bit line (BL),
  wherein the gate (or control gate) electrodes of the first-switch elements of the synapse string array are connected in the direction of the word line (WL) through a string-select line (SSL),
  and wherein the ends of the memory cell elements located at the bottoms of the synapse strings constituting the synapse string array are connected through a source line (SL).

2. The synapse string array according to claim 1, wherein, in order to execute forward propagation of learning, synapse string array is configured to apply an input to a string-select line (SSL) and read an output from a bit line (BL).

3. The synapse string array according to claim 1, wherein, in order to execute backward propagation of learning, the synapse string array is configured to apply an input error to a string-select line (SSL) and read an output error through the bit line (BL).

4. The synapse string array according to claim 1,
  wherein the synapse string array is divided into a first block and a second block, wherein the first block is configured to apply an input through a string-select line (SSL) and read an output through the bit line (BL) in order to execute forward propagation of learning, wherein the second block is configured to apply an input error to a string-select line (SSL) and read an output error through the bit line (BL) in order to execute backward propagation of learning, and wherein on-chip learning is implemented by sequentially driving the first block and the second block to sequentially execute forward propagation and backward propagation.

5. The synapse string array according to claim 4, wherein the memory cell elements constituting the synapse string arrays constituting the second block for the backward propagation are configured to have weights that are randomly distributed.

6. The synapse string array according to claim 1,
wherein the source line (SL) is configured with a single source line (SL), and the cell strings constituting the synapse string array are connected to the single source line (SL), or wherein the source line (SL) is configured to be connected to each other along a direction of the word line (WL), and the cell strings constituting the synapse string array are connected to the respective source lines (SL) along the direction of the word line (WL), or wherein the source line (SL) is configured to be connected to each other along the direction of the bit line (BL) and the cell strings constituting the synapse string array are connected to the respective source lines (SL) along the direction of the bit line (BL).

7. The synapse string array according to claim 1,
wherein the source line (SL) is configured to be connected to each other along the direction of the word line (WL), and the cell strings constituting the synapse string array are connected to the respective source lines (SL) along the direction of the word line (WL), and wherein forward propagation of learning is configured to be executed by applying an input to the bit line (BL) and reading an output through the source line (SL).

8. The synapse string array according to claim 1,
wherein the source line (SL) is configured to be connected to each other along the direction of the word line (WL), and the cell strings constituting the synapse string array are connected to the respective source lines (SL) along the direction of the word line (WL), and wherein backward propagation of learning is configured to be executed by applying an input error to the string-select line (SSL) and read an output error through the bit line (BL).

9. The synapse string array according to claim 1,
wherein the source line (SL) is configured to be connected to each other along the direction of the word line (WL), and the cell strings constituting the synapse string array are connected to the respective source lines (SL) along the direction of the word line (WL), and wherein on-Chip Learning is implemented by sequentially perform an operation of executing forward propagation of learning by applying an input to the bit line (BL) and reading an output through the source line (SL) and an operation of executing backward propagation of learning by applying an input error to the string-select line (SSL) and reading an output error through the bit line (BL).

10. The synapse string array according to claim 1,
wherein an input signal or an input error signal can be input to the synapse string array, and wherein the input signal or the input error signal is configured with one of a rate encoding signal, a width encoding signal, and a temporal encoding signal.

11. The synapse string array according to claim 1, wherein cells connected to an n-th word line (n is a natural number larger than or equal to 1, indicating a layer of a word line) correspond to synapses of an n-th synapse layer of a neural network.

12. The synapse string array according to claim 1,
wherein the memory cell elements of the first and second cell strings of the synapse string are configured as elements (including MOSFETs) having a non-volatile memory function, and wherein the memory cell elements of which pair constitute a synapse morphic element have gate terminals or control gate terminals connected to each other.

13. The synapse string array according to claim 1, wherein the first switch elements of the synapse string are configured with one of a MOSFET, an element having a non-volatile memory function, and an element such as the memory cell element.

14. The synapse string array according to claim 1,
wherein the synapse string further includes second and third switch elements, wherein the second switch elements are connected in series to the first switch elements, respectively, or connected in series between the first and second cell strings and the first switch elements, respectively, wherein the third switch elements are connected in series to ends to which the second switch elements of the first and second cell strings are not connected, respectively, and wherein the second and third switch elements are configured with one of a MOSFET, an element having a non-volatile memory function, and an element such as the memory cell element.

15. The synapse string array according to claim 1,
wherein the synapse string further includes a fourth switch element, wherein the fourth switch element is connected in series to one or two ends of both ends of the synapse string, and wherein the fourth switch element is configured with one of a MOSFET, a MOSFET having a non-volatile memory function, and an element such as the memory cell element.

16. The synapse string array according to claim 1,
wherein a read voltage (read bias) is applied to the connected terminals of the pair of memory cell elements constituting a specific synapse, wherein a pass voltage (pass bias) is applied to the connected terminals of the pairs of memory cell elements constituting the other synapses except for the specific synapse, and wherein information stored in the memory cell elements constituting the specific synapse is read in a state where input signals are applied to input terminals of the first switch elements, respectively.

17. The synapse string array according to claim 1, further comprising a switch element between the memory cell element and the source line SL of the synapse string.

18. The synapse string array according to claim 4, further comprising a switch element between the memory cell elements of the synapse strings of the first block and the second block and the source line.

* * * * *